United States Patent [19]
Hama et al.

[11] Patent Number: 5,818,219
[45] Date of Patent: Oct. 6, 1998

[54] SEMICONDUCTOR TEST SYSTEM HAVING TEST HEAD CONNECTION APPARATUS

[75] Inventors: Hiroyuki Hama, Meiwa-mura; Kazunari Suga, Gyoda, both of Japan

[73] Assignee: Advantest Corp., Tokyo, Japan

[21] Appl. No.: 562,006

[22] Filed: Nov. 22, 1995

[30] Foreign Application Priority Data

Nov. 24, 1994 [JP] Japan ................................. 6-314195

[51] Int. Cl.$^6$ ............................................. G01R 31/02
[52] U.S. Cl. ........................................ 324/158.1; 414/590
[58] Field of Search ............................ 324/158.1, 758, 324/73.1; 414/590; 73/866.5

[56] References Cited

U.S. PATENT DOCUMENTS

| | | | |
|---|---|---|---|
| 4,527,942 | 7/1985 | Smith | 414/590 |
| 5,241,870 | 9/1993 | Holt | 73/866.5 |
| 5,606,262 | 2/1997 | Montalbano et al. | 324/758 |

*Primary Examiner*—Ernest F. Karlsen
*Attorney, Agent, or Firm*—Muramatsu & Associates

[57] ABSTRACT

A semiconductor test system having a test head connection apparatus for connecting and disconnecting a test head of the test system with a wafer prober or a test handler includes a housing formed outside of the semiconductor test system wherein the housing is integral with a body of the test system, a pair of arms provide on the housing for holding the test head wherein the test head rotates about 180 degrees in the arms so that a performance board on the test head faces with a corresponding member on the wafer prober or the test handler, at least one rail built on a floor in a direction which accurately positioning the test head right over the wafer prober or the test handler, a guide mechanism provided on the housing to guide an up-down movement of the arms, a plurality of free casters provided at the bottom of the housing to transfer the test system and the test head toward the wafer prober or the test handler along the rail, and a balancing mechanism for offsetting the weight of the test head so that the up-down movement of the arms holding the test head is controlled with substantially less power.

8 Claims, 7 Drawing Sheets

SEMICONDUCTOR TEST SYSTEM HAVING TEST HEAD CONNECTION APPARATUS

BACKGROUND OF THE INVENTION

This invention relates to a semiconductor test system having a test head connection apparatus for connecting the test head of the semiconductor test system to a test handler or a wafer prober, and more particularly, to a semiconductor test system which is integrally formed with a test head connection apparatus to reduce a floor space for overall test equipments and to improve a test performance by reducing a length of cables between the semiconductor test system and the test head.

A semiconductor test system has a test head which is in a separate housing and electrically connected to the test system through a bundle of cables. Semiconductor devices to be tested (DUT), such as an IC or a semiconductor wafer are provided to the test head by, for example, an automatic test handler or a wafer prober. On the test head, the DUTs are provided with test signals generated by the semiconductor test system and the resultant output signals from the DUTs are transmitted to the semiconductor test system for a evaluation purpose.

When performing a semiconductor test, the test head and a test handler or a wafer prober are connected with each other. Here, a wafer prober is an automatic device for continuously providing semiconductor wafers to be tested to the appropriate position of the test head. A test handler is an automatic device for continuously providing packaged semiconductor devices to be tested, typically packaged ICs, to the appropriate position of the test head. Thus, the DUTs (ICs or semiconductor wafers) positioned by the wafer prober or test handler can receive test signals from the semiconductor test system and resultant signals from the DUTs pass through the test head and flow through the cables to the semiconductor test system.

The test head includes a performance board which has a mechanism for receiving DUTs and is directly coupled with the test handler or the wafer prober. Because the size, the number of pins and many other factors are different between the kinds of DUTs, various kinds of performance boards are prepared for corresponding kinds of DUTs. When testing a different kind of DUTs, the test head is disconnected from the test handler or the wafer prober to replace the performance board. After installing a new performance board, the test handler or the wafer prober is connected to the test head to start the test for the new kind of DUTs.

Since a recent semiconductor device has a large number of input and output pins, for example several hundred pins, the test head to supply and receive various kinds of signals to and from the semiconductor device has a considerably large and heavy structure. For example, a typical test head weighs around 200 kg which requires several persons to work together to connect or disconnect the test head with the test handler or the wafer prober.

Since the performance board is replaced every time when testing a different type of DUT, the test head must be moved for such a replacement purpose, for example several times a day. Therefore, the replacement work for connecting and disconnecting the test head with respect to the test handler or the wafer prober is burdensome and time consuming. To assist the replacement work, a special tool, such as a manipulator is usually used.

FIG. 5 shows an example of conventional method for connecting or disconnecting the test head with the wafer prober by using a manipulator. FIG. 6 shows a plan view of three sets of test equipments each set of which includes a semiconductor test system, a manipulator with a test head and a wafer prober.

In FIG. 5, a manipulator 100 has a body 1 erected on a base 15. The base 15 is supported by a plurality of legs 16 which are fixed on a floor of the room. The base also has a plurality of casters 80 so that the body 1 is freely moveable on the floor. The manipulator 100 has a pair of arms 10 which hold a test head 20 in a manner shown in FIG. 5. The test head 20 is connected with a performance board 30 which has to be changed when another kind of DUT is to be tested as noted above.

The test head 20 is also connected with a bundle of cables 23 to send and receive test signals between a semiconductor test system 27 (FIG. 6) and the test head 20. The semiconductor test system 27 in FIG. 6 is connected to a system console 28 for an operator to control the test equipments. When testing DUTs, the manipulator 100 is operated so that the performance board 30 is connected to a corresponding member 92 of a wafer prober 90 as shown in a dotted line of FIG. 5.

The arm 10 is supported by a rotation support 70 and an up-down support 60. The rotation support 70 rotates with respect to an axis X although a mechanism for which is not shown in the drawings. The rotation support 70 also rotates about 180 degrees in parallel with the floor as shown in FIG. 6. The arm 10 and the test head 20 move up and down when the up-down support 60 is driven by a mechanism including a chain 50 and a handle 40.

When connecting the test head 20 to the wafer prober 90, the manipulator 100 moves to an appropriate position with the use of the casters 80. By positioning the test head 20 having the performance board 30 on the wafer prober 90, the rotation support 70 rotates so that the test head 20 comes close to the wafer prober 90. Operators complete the connection between the test head 20 and the wafer prober 90 by fine adjusting the position between the two.

Manipulators shown in FIGS. 5 and 6 have a relatively large size to sufficiently support the size and weight of the test head 20. For example, the height of the manipulator 100 is two (2) meters, the base 15 has 0.6 square meters, the legs 16 are 2–3 meters long, and the arms are one (1) meter long. Because of this relatively large size, the manipulator 100 requires a floor area which is more than twice as the space required by the semiconductor test system 27.

FIG. 6 shows an example of a floor area for arranging test equipments including the semiconductor test systems, manipulators holding the test heads and the wafer probers. In the example of FIG. 6, three sets of test equipments are arranged on the floor. Since the manipulator 100 causes the movement of the test head 20 involving the rotation support 70 as well as requires the work by operators for connecting and disconnecting the test head 20 for exchanging the performance board 30, a relatively large floor space is required in the arrangement of FIG. 6.

In the example of FIG. 6, the manipulator 100 needs a space for the test head 20 be positioned at the side of the wafer prober 90. In this position, the manual work by the operators for replacing the performance board 30 on the test head 20 is proceeded. The replacement of the performance board 30 is not always necessary to be performed at the side of the wafer prober, for example, such a replacement work can be carried out by positioning the test head 20 over the wafer prober 90. Or the replacement work can be done while the manipulator 100 further goes back toward the test system 27 in such a way that the test system, manipulator, test head and wafer prober are aligned in one line.

However, in practice, since a maintenance work for the wafer prober is sometimes necessary, it is preferable to arrange the manipulator as shown in FIG. 6 so that the test head is positioned at the side of the wafer prober when both members are not connected with each other. Further, this arrangement of FIG. 6 is considered to be superior to the one line alignment where the test system 27, the manipulator 100, the test head 20 and the wafer prober are arranged in a manner to form a one line because the cable 23 in the example of FIG. 6 can be shorter.

However, the total floor area required for the arrangement of FIG. 6 is about 43.2 (5.4 m×8.0 m) square meters, which is considerably large. In addition, the cable 23 is still too long to transmit the test signals therethrough with high reliability. Since the bundle of cables 23 include several hundreds of signal lines, to shorten the cable 23 is important to eliminate unwanted effects such as cross talks between the signal lines or influences of noise or other signal distortions caused by propagation delays.

Other conventional example of connecting or disconnecting the test head 20 with respect to the wafer prober or test handler is shown in FIG. 7 wherein a weight reducer 110 is used to rotate the test head 20. The weight reducer 110 includes a pair of arms 11 to hold the test head 20 having the performance board 30. The arms 11 rotate 180 degrees around an axis Y so that the test head 20 comes either at the side of the wafer prober 90 or top of the wafer prober 90. The test systems 27 and the system consoles 28 are arranged similarly to the example of FIG. 6. The cable 23 is connected between the semiconductor test system 27 and the test head 20.

The weight reducer 110 also includes a mechanism (not shown) which reduces the weight of the test head so that operators can easily rotate the arms 11 and the test head as above. Examples of such mechanism are, a use of a balancing weight or a use of a motor or other drive forces such as an air cylinder. The replacement work for changing the performance board 30 is carried out by placing the test head 20 at the side of the wafer as shown in FIG. 7. The weight reducer 110 is carefully positioned such that when the test head 20 comes over the wafer 90, the test head 20 and the wafer prober 90 are accurately connected.

Unlike the manipulator of FIG. 5 and 6, since the weight reducer 110 is not moveable, the arrangement of FIG. 7 requires a less floor space. For example, the three sets of test equipments as shown in FIG. 7 occupy a floor space of 39.3 (5.1 m×7.7 m) square meters which is smaller than the layout of FIG. 6. However, the example of FIG. 7 still occupies a large floor area and also requires a relatively long cable 23 having a large number of signal lines.

Therefore, the conventional arrangements of connecting and disconnecting the test head with respect to the wafer prober or the test handler have disadvantages. One such disadvantage is that the conventional arrangement requires a relatively large floor space. Since the test equipments as shown in FIGS. 6 and 7 are usually installed in a clean room having a very high degree of removing the dust and other contaminating agents, the space cost of such a clean room is very high while the market demands for reduction of the cost of the semiconductor devices are very strong.

Therefore, in the semiconductor industry, it is important to increase a test efficiency per floor space to lower an overall cost of the semiconductor devices. The conventional arrangements of FIGS. 5 and 6 are inadequate for such requirements because it requires a larger floor space which is high cost. Thus, there is a need to minimize a floor space for the test equipment involving mechanism for connecting and disconnecting the test head and the wafer prober or the test handler.

Another disadvantage in the conventional arrangement is that the cable 23 connecting the test head and the test system needs to be substantially long mainly because the manipulator or the weight reducer which is a large structure exists between the test system and the test head. The test signals transmitting through the signal lines in the cable 23 must be precisely controlled in timing, phase and wave shape to test a high speed and complicated semiconductor device.

However, when the cable is long, the test signals are adversely affected by noises caused by cross talk between the signal lines or external noises, propagation delays in the signal lines which deteriorate the wave shape or other causes. Thus, there is a need to minimize a cable length between the test system and the test head for the test equipment arrangement involving mechanism for connecting and disconnecting the test head and the wafer prober or the test handler.

A further disadvantage of the conventional technology incorporating the manipulator or the weight reducer is that it is not cost effective. The manipulator and the weight reducer are relatively expensive, one of the reasons of which is that these mechanism require a large base and body to support the weight of the test head. The cost of these mechanism also adversely affects the overall cost of the semiconductor devices. Thus, there is a need to minimize a cost associated with the mechanism for connecting and disconnecting the test head and the wafer prober or the test handler.

SUMMARY OF THE INVENTION

Therefore, it is an object of the present invention to provide a semiconductor test system having a test head connection apparatus which is capable of minimizing a floor space required for an arrangement of connecting and disconnecting a test head of the test system with a wafer prober or a test handler.

It is another object of the present invention to provide a semiconductor test system having a test head connection apparatus which is capable of minimizing the length of cables between the semiconductor test system and the test head to improve electrical test performance of the test system involving an arrangement of connecting and disconnecting the test head with the wafer prober or the test handler.

It is a further object of the present invention to provide a semiconductor test system having a test head connection apparatus which is capable of reducing the cost of the semiconductor test system involving an arrangement of connecting and disconnecting the test head with the wafer prober or the test handler.

It is a further object of the present invention to provide a semiconductor test system having a test head connection apparatus which is capable of easily and accurately transferring the test head to the appropriate position for connecting and disconnecting the test head with the wafer prober or the test handler.

To accomplish these objectives, a semiconductor test system having a test head connection apparatus for connecting and disconnecting a test head of the test system with a wafer prober or a test handler includes a housing formed outside of the semiconductor test system wherein the housing is integral with a body of the test system, a pair of arms provide on the housing for holding the test head wherein the test head rotates about 180 degrees in the arms so that a performance board on the test head faces with a corresponding member on the wafer prober or the test handler, at least one rail built on a floor in a direction which accurately positioning the test head right over the said wafer prober or the test handler, a guide mechanism provided on the housing to guide an up-down movement of the arms, a plurality of free casters provided at the bottom of the housing to transfer the test system and the test head toward the wafer prober or the test handler along the rail, and a balancing mechanism for offsetting the weight of the test head so that the up-down movement of the arms holding the test head is controlled with substantially less power.

According to the present invention, the floor space is dramatically reduced because the mechanism for connecting and disconnecting the test head is integrally formed with the body of the semiconductor test system. For example, the present invention requires less than 70% of the overall floor space than the conventional example which includes the manipulators. Further, the present invention requires about 75% of the overall floor space of the conventional example which includes the weight reducers.

Further, according to the present invention, a cable which connects the test system and the test head is dramatically reduced in length since the test system and the arms for holding the test head are integrally formed. Since the cable is very short, the test signals propagating through a number of signal lines in the cable are not deteriorated by the noises, cross talks or propagation delays. Accordingly, more reliable semiconductor device test can be achieved in the structure of the present invention.

Since the semiconductor test system and the test head move on the rails constructed on the floor, such a movement is smoothly and accurately achieved without shocks or vibrations. The test system having the test head connection apparatus of the present invention can easily and accurately transfer the test head to the appropriate position for connecting and disconnecting the test head to the wafer prober or the test handler since such a transfer movement is guided by the rails built accurately on the floor.

The test head connection apparatus of the present invention includes a weight on the rear of the test system to balance the weight of the test head, thus the up-down movement of the test head is easily achieved with less power as well as the test system is well balanced on the rail. The connection of the test head and the wafer prober or the test handler is carried out smoothly since the test head of the present invention includes an elastic material which functions as a shock absorber.

The semiconductor test system having the test head connection apparatus of the present invention dramatically reduces the cost involving the arrangement for connecting and disconnecting the test head with the wafer prober or the test handler. One of the reasons of which is that the weight and the body of the test system itself are used as a mechanism for supporting the test head.

The semiconductor test system having a test head connection apparatus of the present invention can transfer its position and accesses to either the wafer prober or the test handler on the rails constructed in a backward and forward direction as well as a right and left direction.

DETAILED DESCRIPTION OF THE PREFERRED EMBODIMENT

Figure 1:
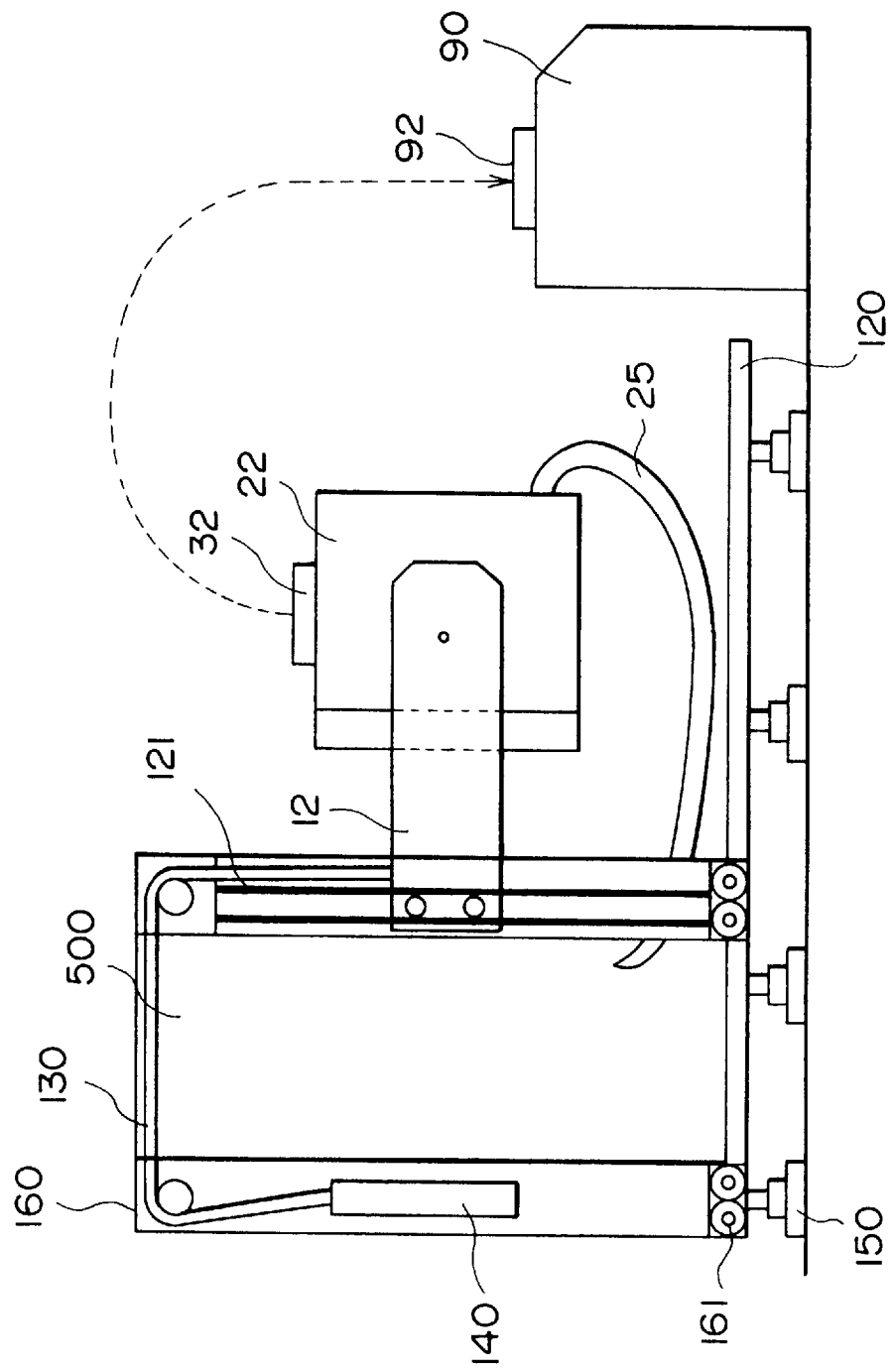
FIG. 1 is a side view of a semiconductor test system having a test head connection apparatus in accordance with the first embodiment of the present invention.

One of the embodiment of the present invention is shown in FIG. 1 which is a side view of a semiconductor test system having a test head connection apparatus. A semiconductor test system 500 is integrally provided with an outer housing 160. The housing 160 has a plurality of free casters 161 which are mounted on a pair of rails 120 built on a floor by means of rail supports 150. The housing 160 includes therein a guide rail 121, a chain 130 and a weight 140. A pair of arms 12 are connected to the guide rail 121 such that the arms 12 are moveable in an up-down direction through the guide rail 121.

The pair of arms 12 hold a test head 22 having a performance board 32. The arms 12 are so arranged that the test head 22 can rotates in the arms in a direction shown by a dotted line of FIG. 1. The weight 140 is used to balance the weight of the test head and other mechanism such as the guide rail 121 and arms 12 on the other side of the housing 160 to ease the up-down movement of the arm and test head. Although not shown in the drawings, a drive mechanism such as a motor or an air cylinder may be provided to drive the arms and test head. Preferably, although not shown, there may be a manual or automatic mechanism to drive the test system 500 forward and backward on the rail 120.

The rails 120 are carefully aligned so that when the test system 500 approaches a wafer prober 90 (or a test handler), the test head 22 can be accurately connected to the wafer prober 90. When the test head 22 and the wafer prober 90 are connected with each other, the performance board 32 is attached to a corresponding member 92 on the wafer prober 90, and then a semiconductor test will be performed for a semiconductor wafer which is automatically provided by the wafer prober 90.

For replacing the performance board 32 for testing a kind of wafer different from the previous one, the test head 22 is disconnected from the wafer prober 90 and the test system 500 retreats from the wafer prober 90. The test head 22 is lowered and rotated in the arms 12 so that the performance board 32 faces upward. In this situation, the performance board 32 will be replaced with a new one which is suitable for the next kind of wafers. The test head 22 will be shifted upward and the test system advances on the rail 120 to a position right above the waver 90. The test head 22 is rotated 180 degrees to be connected to the wafer prober 90 by a fine adjustment of the downward position.

A cable 25 has an enough length to allow the 180 degrees rotation of the test head 22 in the arms 12. In the present invention, the cable 25 can be significantly shorter than the cable 23 of the conventional arrangement shown in FIGS. 5–7 because the test system 500 and the test head 22 are fixed close together by the arms 12. In contrast, the cable 23 in the conventional technology requires to be significantly longer than the cable 25 mainly because the manipulator 100 or the weight reducer 110 is positioned between the test system and the test head.

Figure 2:
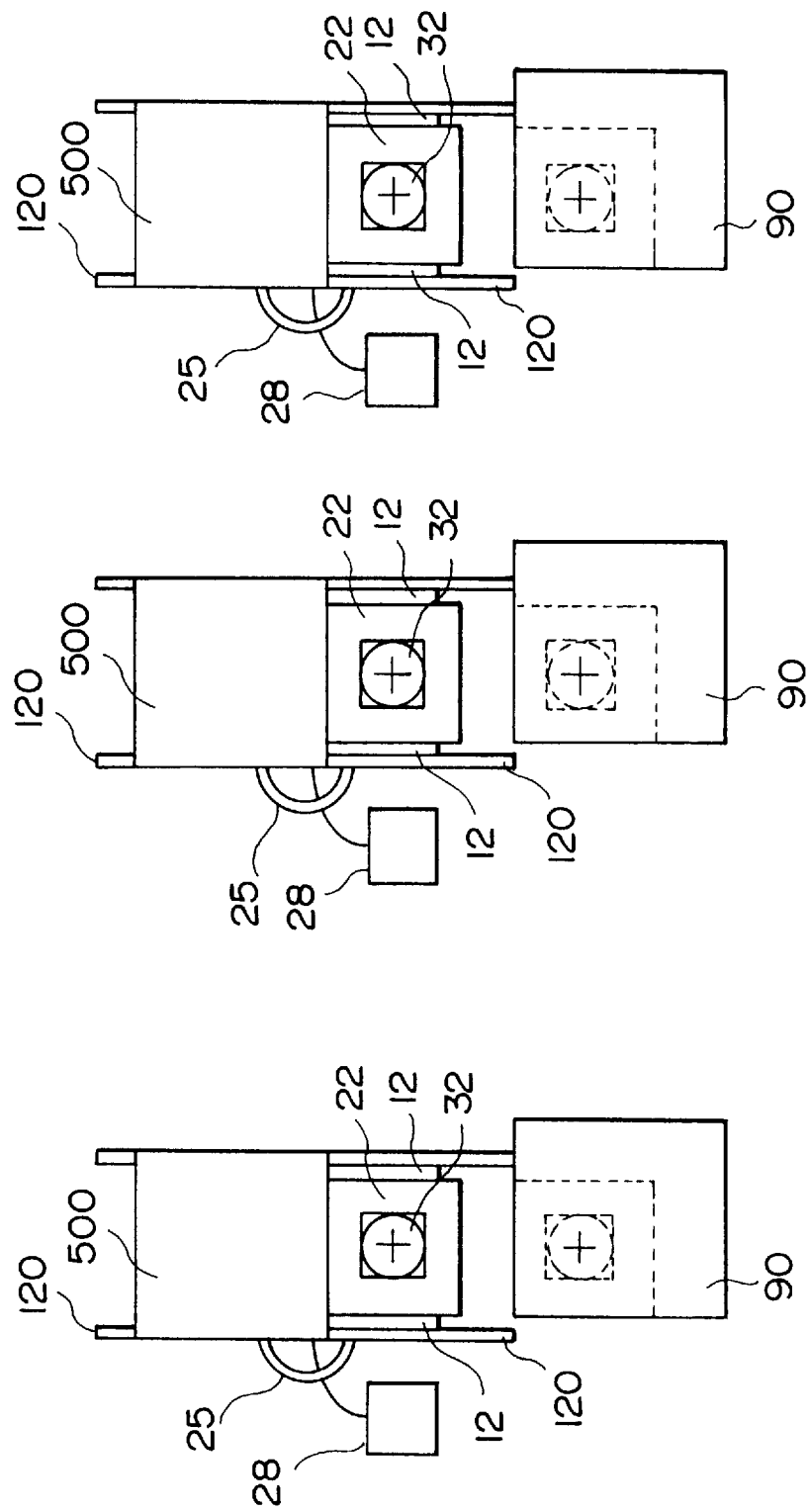
FIG. 2 is a plan view showing a layout of three sets of the semiconductor test systems of the present invention of FIG. 1.

FIG. 2 is a plan view showing a floor layout of three sets of the semiconductor test systems of the present invention shown in FIG. 1. Since each pair of the semiconductor test system 500 and the test head 22 are integrally structured, i.e., no separate structure like the manipulator or the weight reducer is necessary, a required floor area is clearly smaller than that of the prior art. For example, the overall floor space for this three sets in this invention is 29.6 (4.7 m×6.3 m) square meters, which is less than 70% of the example of FIG. 6.

Figure 5:
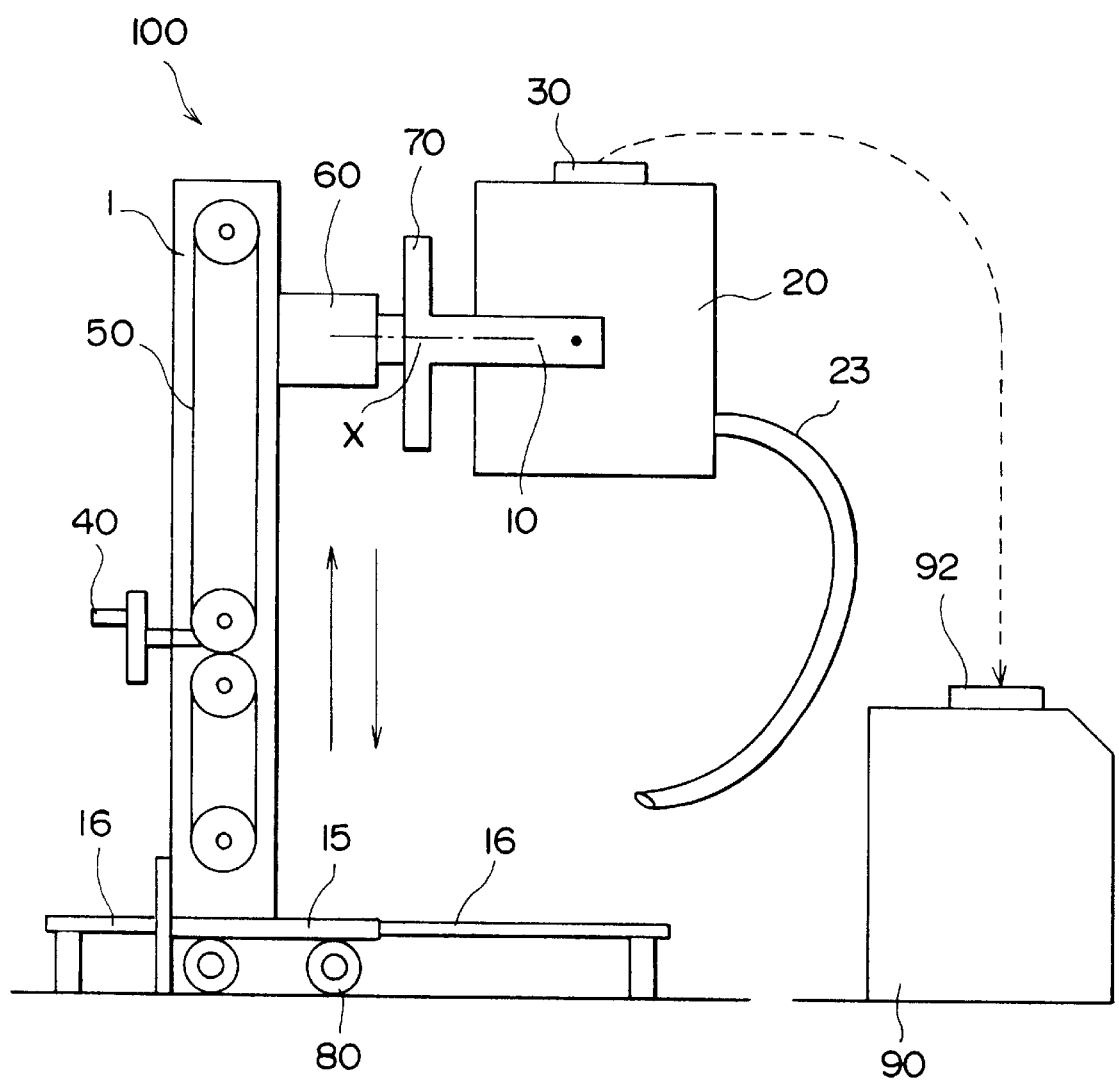
FIG. 5 is a side view showing a conventional arrangement of connecting and disconnecting the test head by using a manipulator.
Figure 6:
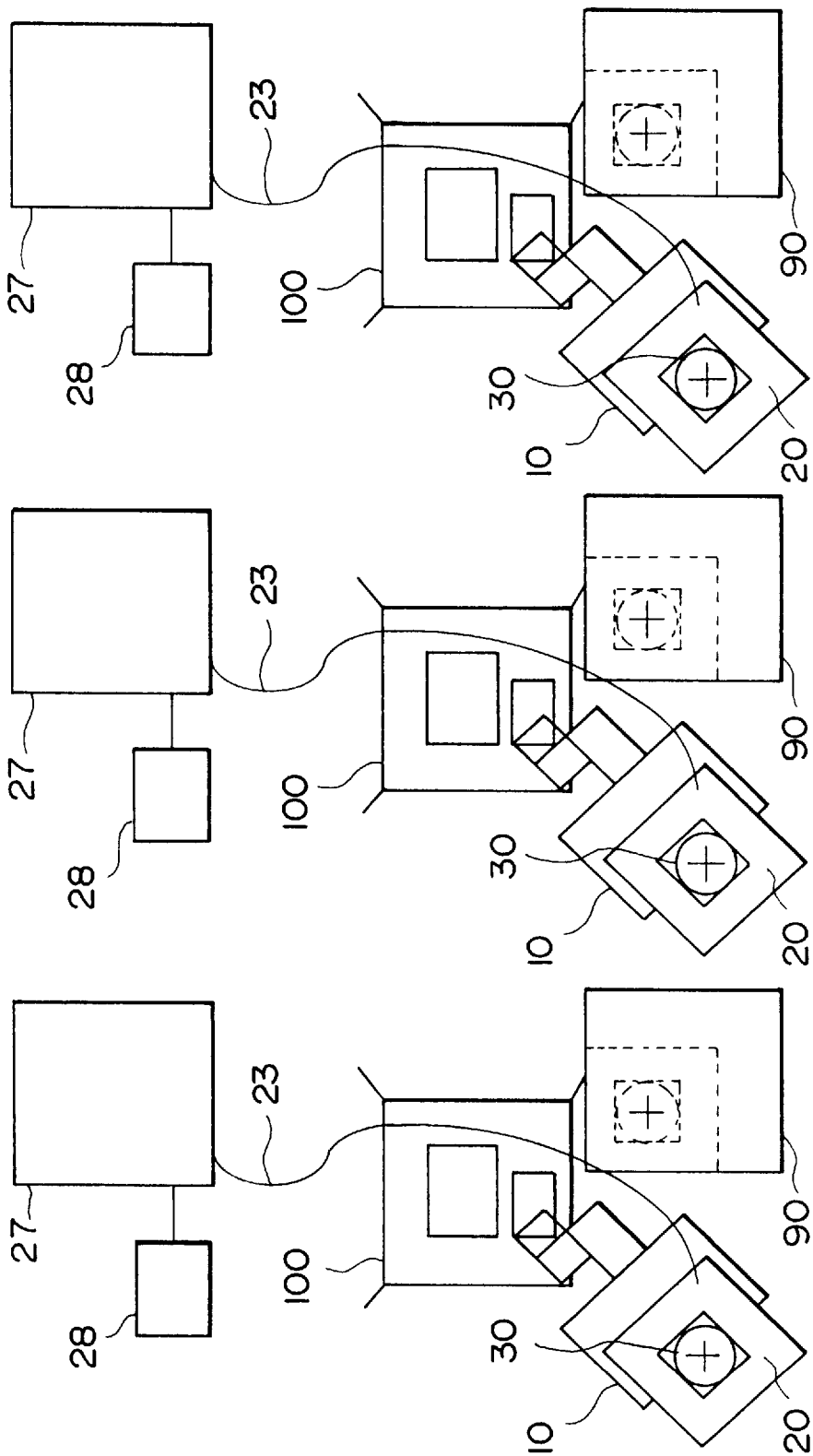
FIG. 6, is a plan view showing a layout of three sets of the semiconductor test systems of the conventional technology of FIG. 5 involving the manipulator.
Figure 7:
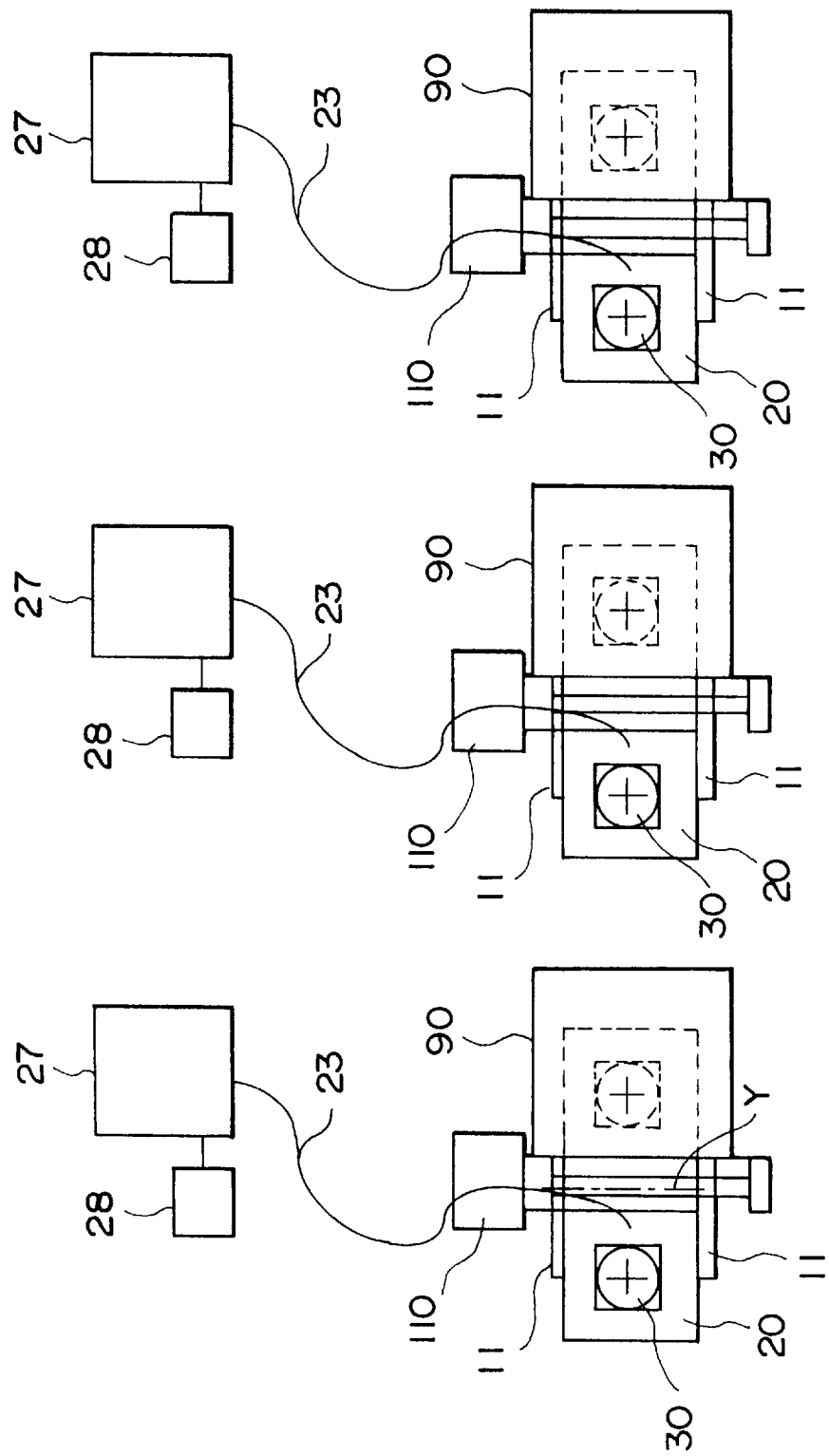
FIG. 7 is a plan view showing a layout of three sets of the semiconductor test systems of another conventional technology involving a weight reducer.

As is clear in FIG. 2, the cables 25 are considerably shorter than the cables 23 in FIGS. 5–7 because the test system 500 and the test head are connected through the arms 12 in the closest proximity. Since the cable 25 is very short, the test signals propagating through a number of signal lines in the cable 25 are not deteriorated by the noise, cross talk or propagation delay as mentioned with respect to the conventional technology.

Figure 4:
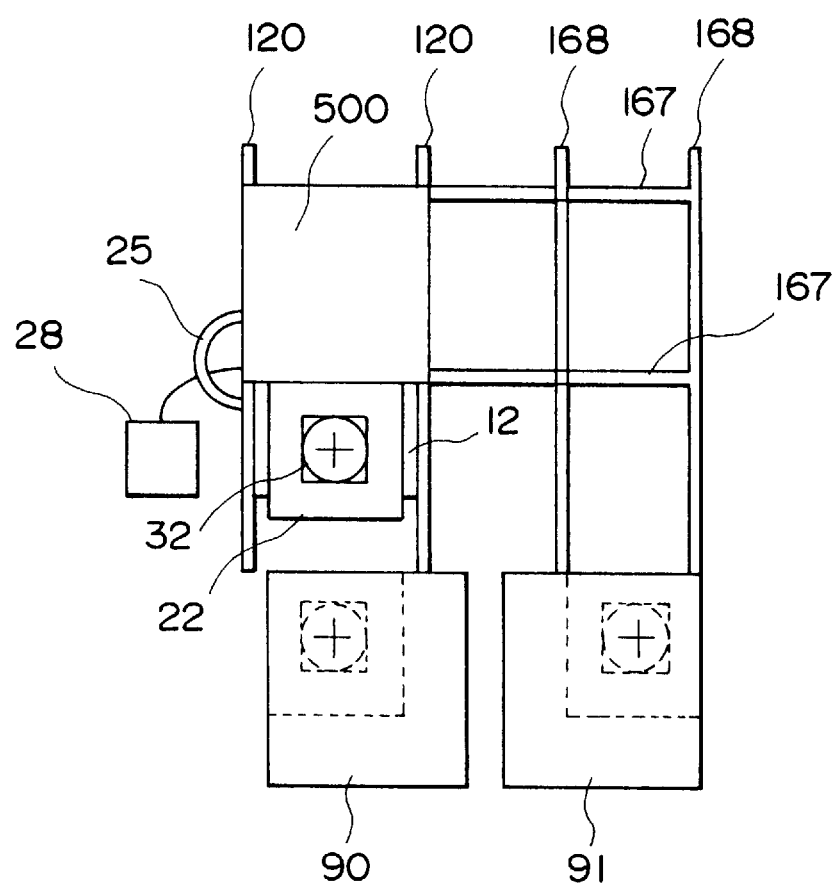
FIG. 4 is a plan view showing a rail arrangement for the semiconductor test system of FIG. 1 in accordance with the second embodiment of the present invention.

FIG. 4 is a plan view of another embodiment of the present invention. In this example, in addition to the wafer prober 90, a test handler 91 is aligned to receive the test head 22 to automatically supply the packaged semiconductor devices to the test head. Additionally, rails 167 and 168 are built on the floor as shown in FIG. 4. The rails 167 are used for a right and left movement of the test system and the rails 168 are used for a forward and backward movement of the test system. The free casters 161 attached to the housing 160 change from the rails 120 to the rails 168 through the rails 167 to bring the test system 500 and the test head 22 to the test handler 91. The rails and the free casters applicable to the present invention are well known in the art, and thus no further description is given regarding their structures.

Figure 3:
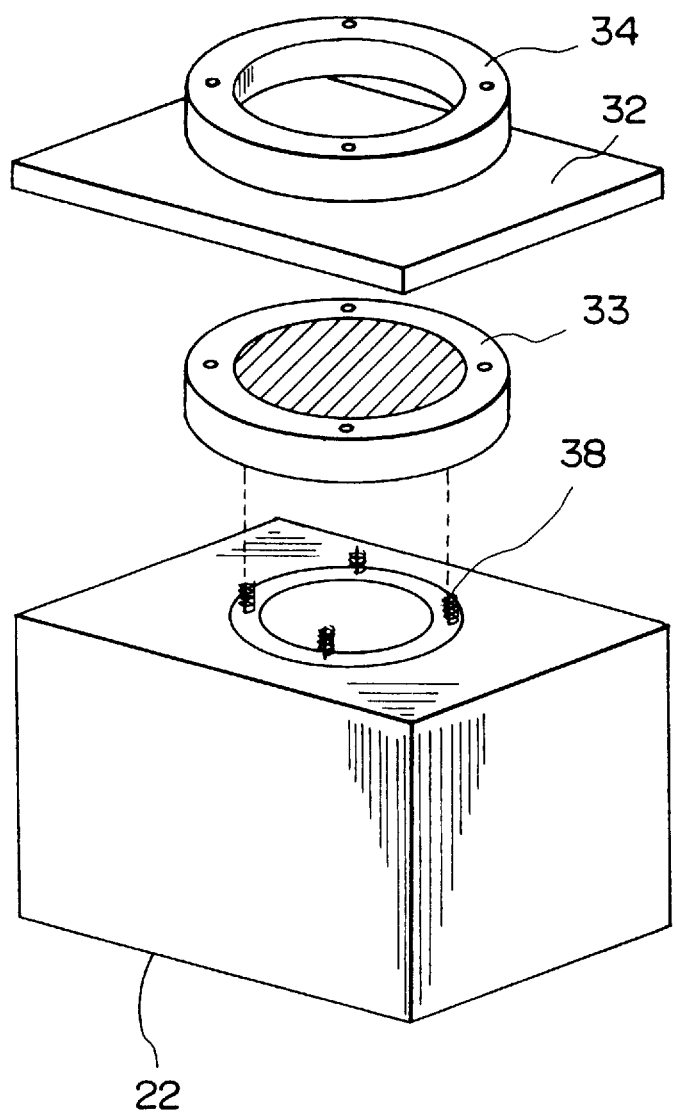
FIG. 3 is a perspective view of the test head in accordance with the third embodiment of the present invention.

FIG. 3 shows a further embodiment of the present invention in which it is shown a perspective view of the test head 22. This invention is particularly related to a performance board attachment structure on the top of the test head 22. Generally, the performance board attachment structure includes a performance board 32 which includes a device unique contact socket, a signal contactor assembly 33 which includes a large number of contact pins which electrically contact with contact socket, and a performance board locking ring 34 which is used to fix the performance board on the test head 22. In this invention, an elastic member 38 is newly provided as a shock absorber in connecting the test head and the wafer prober or test handler. Although the example of FIG. 3 shows coil springs, other elastic materials such as synthetic rubber, air cylinders or plate springs can be equally used.

In the examples of FIGS. 1, 2 and 4, a pair of rails are used. However, a single rail may also be sufficient as long as the test system is so constructed on the floor to be moveable along the rail. Further, the rails can be constructed directly on the floor without using the rail supports 150 of FIG. 1.

As has been foregoing, according to the present invention, the floor space is dramatically reduced because the mechanism for connecting and disconnecting the test head is integrally formed with the body of the semiconductor test system. For example, the present invention requires less than 70% of the overall floor space than the example of FIG. 6 which includes the manipulators 100. Further, the present invention requires about 75% of the overall floor space of the example of FIG. 7 which includes the weight reducers 110.

Further, according to the present invention, the cable 25 which connects the test system 500 and the test head 22 is dramatically reduced in length since the test system and the arms for holding the test head are integrally formed. Thus, the cable 25 between the test system and the test head can be minimized. Since the cable 25 is very short, the test signals propagating through a number of signal lines in the cable 25 are not deteriorated by the noise, cross talk or propagation delay as mentioned with respect to the conventional technology. Accordingly, the more reliable semiconductor device test can be achieved in the structure of the present invention.

Since the semiconductor test system and the test head move on the rails, such a movement is smoothly achieved without shocks or vibrations. The test system having the test head connection apparatus of the present invention can easily and accurately transferring the test head to the appropriate position for connecting and disconnecting the test head to the wafer prober or the test handler since such transfer movement is guided by the rails built accurately on the floor.

The test head connection apparatus of the present invention includes the weight 140 on the rear of the test system 500 to balance the weight of the test head, the up-down movement of the test head is easily achieved with less power. The connection of the test head and the wafer prober or the test handler is carried out smoothly since the test head of the present invention includes the elastic material which functions as a shock absorber.

The semiconductor test system having a test head connection apparatus of the present invention dramatically reduces the cost involving the arrangement of connecting and disconnecting the test head to the wafer prober or the test handler. One of the reasons of which is that the weight and the housing of the test system itself are used as a mechanism for supporting the test head. For example, the cost of the present invention involving the test head connection is 1/10 of the example of FIG. 5 using the manipulator and 1/5 of FIG. 7 using the weight reducer.

The semiconductor test system having a test head connection apparatus of the present invention can transfer its position and accesses to either the wafer prober or the test handler on the rails constructed in a backward and forward direction as well as a right and left direction.

What is claimed is:

1. A test head connection apparatus for connecting and/or disconnecting a test head of a semiconductor test system with a wafer prober or a test handler, comprising:

a housing of said test head connection apparatus formed outside of said semiconductor test system in a manner of covering said semiconductor test system, said housing being mechanically fixed to a body of said semiconductor test system;

a pair of arms attached on said housing at a first area formed between a first outer surface of said semiconductor test system and said housing for holding said test head, said test head rotating about 180 degrees in said arms so that a performance board on said test head facing with a corresponding member on said wafer prober or said test handler;

at least one rail built on a floor in a direction toward said wafer prober or said test handler for accurately positioning said test head right over said wafer prober or said test handler;

a guide mechanism provided in said first area of said housing to guide an up-down movement of said arms;

a plurality of free casters provided at the bottom of said housing to transfer said test system and said test head toward said wafer prober or said test handler along said rail; and a balancing mechanism provided in a second area formed between a second outer surface of said semiconductor test system and said housing, said second outer surface being opposite to said first outer surface of said semiconductor test system, said balancing mechanism reducing the weight of said test head for said up-down movement.

2. A test head connection apparatus as defined in claim 1, wherein said arms are protruded from said housing in a direction toward said wafer prober or said test handler, said arms being connected to said guide mechanism in said housing.

3. A test head connection apparatus as defined in claim 1, wherein said rail is supported by a plurality of rail supports provided between said floor and said rail.

4. A test head connection apparatus as defined in claim 1, wherein said semiconductor test system and said test head are electrically connected by a cable which includes a plurality of signal lines to transmit test signals between said test system and said test head.

5. A test head connection apparatus as defined in claim 1, wherein said guide mechanism is a guide rail formed in a vertical direction in said first area of said housing, said guide rail receiving bases of said arms to guide said arms along said guide rail.

6. A test head connection apparatus as defined in claim 1, wherein said balancing mechanism includes a weight and a chain or belt connecting said weight and said arms.

7. A test head connection apparatus as defined in claim 1, wherein said test head includes an elastic member between a body of said test head and said performance board to absorb a shock involved in connecting said test head to said wafer prober or said test handler.

8. A test head connection apparatus as defined in claim 1, further includes additional rails to selectively guide said test system and said test head to said wafer prober or said test handler.

* * * * *